United States Patent [19]
Viterbi et al.

[11] Patent Number: 5,933,462
[45] Date of Patent: Aug. 3, 1999

[54] SOFT DECISION OUTPUT DECODER FOR DECODING CONVOLUTIONALLY ENCODED CODEWORDS

[75] Inventors: Andrew J. Viterbi, La Jolla; Nagabhushana T. Sindhushayana, San Diego, both of Calif.

[73] Assignee: QUALCOMM Incorporated, San Diego, Calif.

[21] Appl. No.: 08/743,688

[22] Filed: Nov. 6, 1996

[51] Int. Cl.$^6$ .............................. H03D 1/00; H04L 27/06
[52] U.S. Cl. ......................... 375/341; 375/262; 371/43.7; 371/43.8
[58] Field of Search ..................... 375/262, 265, 375/341, 254, 285, 346, 348, 377; 455/63, 296; 371/43.4, 43.6, 43.7, 43.8, 43.1; 360/51

[56] References Cited

U.S. PATENT DOCUMENTS

| | | | |
|---|---|---|---|
| 5,442,627 | 8/1995 | Viterbi et al. | 370/22 |
| 5,583,889 | 12/1996 | Citta et al. | 375/341 |
| 5,600,677 | 2/1997 | Citta et al. | 375/296 |
| 5,629,958 | 5/1997 | Wiiming | 375/295 |
| 5,636,251 | 6/1997 | Citta et al. | 375/341 |

*Primary Examiner*—Chi H. Pham
*Assistant Examiner*—Jean B Corrielus
*Attorney, Agent, or Firm*—Russell B. Miller; Thomas R. Rouse; Kyong H. Macek

[57] ABSTRACT

A soft decision output decoder and decoding method. The decoder decodes a sequence of signals output by an encoder and transmitted over a channel. The soft decision output decoder includes a first "generalized" Viterbi decoder for decoding the sequence of signals received over the channel during a forward iteration through a trellis representing the encoder output having a block length T. The first "generalized" Viterbi decoder begins at an initial state $t_0$ and provides a plurality of forward iteration state metrics $\alpha$ for each state at each time interval over a window of length 2L, where L is on the order of a few constraint lengths and 2L is less than a block length T. A second "generalized" Viterbi decoder decodes the sequence of signals received over the channel during a backward iteration through the trellis. The second decoder starts at a second time t2L and provides a plurality of backward iteration state metrics $\beta$ for each state at each time interval. A processor then performs a dual maxima computation at each state using the forward state metric, the backward state metric and the branch metric for same to provide a measure of the likelihood that a particular sequence of data was transmitted by the encoder. The processor computes a log of the likelihood ratio using the forward and backward state metrics and the branch metrics for a selected state. This is achieved by first computing a max function as an approximation of the measure of the likelihood that a particular sequence of data was transmitted by the encoder. By performing forward and backward Viterbi decoding with dual maxima computations at each node within a window moved over the trellis, the inventive decoder provides the performance benefits associated with a LOG-MAP decoder while avoiding the excessive memory requirements of same.

23 Claims, 6 Drawing Sheets

SOFT DECISION OUTPUT DECODER FOR DECODING CONVOLUTIONALLY ENCODED CODEWORDS

BACKGROUND OF THE INVENTION

I. Field of the Invention

The present invention relates to communications systems. More specifically, the present invention relates to systems for encoding and decoding data in digital communication systems.

II. Description of the Related Art

Communication systems facilitate transmission and reception of information from a source to a physically separate receiver. Mobile communications systems are typified by the movement of a receiver relative to a transmitter or vice versa. The communications link between transmitters and receivers in a mobile communications systems is characterized as a fading channel. Mobile satellite communications systems, having a transmitter on a spacecraft and a receiver on a ground based vehicle, cellular telephone systems and terrestrial microwave systems are examples of fading communications systems. A fading channel is a channel which is severely degraded. The degradation is due to numerous effects including multipath fading, severe attenuation due to the receipt via multiple paths of reflections of the transmitted signal off objects and structures in the atmosphere and on the surface. Other effects contributing to the impairment of the faded channel include Doppler shift due to the movement of the receiver relative to the transmitter and additive noise.

While both analog and digital communication methods have been used, digital methods afford several advantages including: improved immunity to channel noise and interference, increased capacity, and improved security of communication through the use of encryption.

Typically, an information signal is first converted into a form suitable for efficient transmission over the channel. Conversion or modulation of the information signal involves varying a parameter of a carrier wave on the basis of the information signal in such a way that the spectrum of the resulting modulated carrier is confined within the channel bandwidth. At a user location, the original message signal is replicated from a version of the modulated carrier received subsequent to propagation over the channel. Such replication is generally achieved by using an inverse of the modulation process employed by the source transmitter.

The field of data communications is particularly concerned with optimizing data throughput of a transmission system with a limited signal to noise ratio (SNR). The use of error correcting circuitry, such as encoders and decoders, allows system tradeoffs to be made with smaller SNRs or higher data rates to be used with the same bit error rate (BER).

One class of encoders is known as a convolutional encoder. As is well known in the art, a convolutional encoder converts a sequence of input data bits to a codeword based on a convolution of the input sequence with itself or with another signal. Coding rate and generating polynomials are used to define a convolutional code. Convolutional encoding of data combined with a Viterbi decoder is a well known technique for providing error correction coding and decoding of data.

Coding rate and constraint length are used to define a Viterbi decoder. A coding rate (k/n) corresponds to the number of coding symbols produced (n) for a given number of input bits (k). The coding rate of ½ has become one of the most popular rates, although other code rates are also generally used. A constraint length (K) is defined as the length of a shift register used in a convolutional encoding of data. A constraint length of seven (K=7) is typical in convolutional coding schemes. The convolutional encoder can be thought of as a Finite Impulse Response filter with binary coefficients and length K−1. This filter produces a symbol stream with $2^{-1}$ possible states.

The basic principle of the Viterbi algorithm is to take a convolutionally encoded data stream that has been transmitted over a noisy channel and use a finite state machine to efficiently determine the most likely sequence that was transmitted. The fundamental concept of a K=7 Viterbi decoder is that it is a machine that hypothesizes each of the possible 64 states that the encoder could have been in and determines the probability that the encoder transitioned from each of those states to the next set of 64 possible encoder states, given what was received. The probabilities are represented by quantities called metrics, which are proportional to the negative of the logarithm of the probability. Adding of the metrics is therefore the equivalent to the reciprocal of the product of the probabilities. Thus, smaller metrics correspond to higher probability events.

There are two types of metrics: state metrics, sometimes called path metrics; and branch metrics. The state metric represents the probability that the received set of symbols leads to the state with which it is associated. The branch metric represents the conditional probability that the transition from one state to another occurred assuming that the starting state was actually the correct state and given the symbol that was actually received.

There are two possible states leading to any other state, each corresponding to the occurrence of a zero or a one in the right-most bit of the convolutional encoder shift register. The decoder decides which is the more likely state by an add-compare-select (ACS) operation. Add refers to adding each state metric at the preceding level to the two branch metrics of the branches for the allowable transitions. Compare refers to comparing the pair of such metric sums for paths entering a state (node) at the given level. Select refers to selecting the greater of the two and discarding the other. Thus, only the winning branch is preserved at each node, along with the node state metric. If the two quantities being compared are equal, either branch may be selected, for the probability of erroneous selection will be the same in either case.

The Viterbi algorithm is a computationally efficient method of updating the conditional probabilities of the best state and the most probable bit sequence transmitted from the possible $2^{K-1}$ states. In order to compute this probability, all $2^{K-1}$ states for each bit must be computed. The resulting decision from each of these computations is stored as a single bit in a path memory.

A chain-back operation, an inverse of the encoding operation, is performed in which the C decision bits are used to select an output bit, where C is the chainback distance. After many branches the most probable path will be selected with a high degree of certainty. The path memory depth must be sufficiently long to be governed by the signal-to-noise ratio and not the length of the chain-back memory.

Though it is not necessary for analyzing either the code characteristics or the performance of the optimal decoder, it is useful in understanding both to exhibit the code on a trellis diagram. The term "trellis" is a term which describes a tree in which a branch not only bifurcates into two or more branches but also in which two or more branches can merge into one. A trellis diagram is an infinite replication of the state diagram for an encoder. The nodes (states) at one level in the trellis are reached from the node states of the previous level by the transition through one branch, corresponding to one input bit, as determined by the state diagram. Any codeword of a convolutional code corresponds to the symbols along a path (consisting of successive branches) in the trellis diagram.

Convolutional codes with Viterbi decoders have been used extensively to achieve reliable communication over power limited channels such as satellite communication systems and interference limited channels such as CDMA wireless communication systems. In a paper by G. Ungerboeck entitled "Channel Coding with Multilevel/Phase Signals", IEEE Transactions of Information Theory, Vol. IT-28, No. 1, January 1982, pp. 55–67, Ungerboeck used convolutional codes matched to two-dimensional signal constellations, to achieve coding gains of up to 6 dB (with respect to uncoded systems) over band limited channels. This technique is known as trellis coded modulation, and is widely used in data communication over voice-band telephone modems, digital transmission over coaxial cables, etc. G. D. Forney, Jr., in his treatise *Concatenated Codes*, Massachusetts Institute of Technology, 1966, developed a multilevel coding structure (consisting of a convolutional code and a block code) known as a concatenated code, which has been employed in deep space, resulting in very high coding gains.

The achievements mentioned above represent significant milestones in the continuing effort at reducing the gap between the performance of practical communication systems and the fundamental limits imposed by the Shannon Theorem. The Shannon limit refers to the minimum signal-to-noise ratio needed to communicate reliably over a given communication medium at a given spectral (bandwidth) efficiency. Recently, researchers have developed new classes of error correcting codes such as Turbo Codes and Serial Concatenated Interleaved Codes (SCIC), which provide further increases in performance over classical concatenated codes. These codes have been shown to achieve reliable communication at less than 1 dB above the Shannon limit. The use of Turbo Codes is described in a paper by C. Berrou entitled "Near Shannon Limit Error-Correcting Coding and Decoding: Turbo Codes," *Proceedings of ICC '93*, Geneva, Switzerland, pp. 1064–1070, May 1993. Serial Concatenated Codes are described in S. Benedetto's paper "Serial Concatenation of Interleaved Codes: *Performance Analysis, Design, and Iterative Decoding*," TDA Progress Report 42–126.

The Turbo Codes as well as Serial Concatenated Codes employ iterative decoding schemes, in which each iteration uses one or more soft-decision output trellis decoders. The overwhelming success of these codes has refocused attention on soft decision trellis decoders. J. Hagenauer describes a soft output Viterbi algorithm (SOVA) using soft output metric decoders in his paper "Iterative (Turbo) Decoding of Systematic Concatenated Codes with MAP and SOVA Algorithms," Proceedings of the ITG Conference on Source and Channel Coding, Frankfurt Germany, pp. 1–9, October 1994. In addition, J Hagenauer describes a soft output Viterbi algorithm in his paper "Concatenated Viterbi Decoding", *Proceedings of the Fourth Joint Swedish-Soviet Int. Workshop on Information Theory*, Gotland Sweden, pp. 29–33, August 1989.

While MAP decoders offer significant performance gains over SOVA decoders, it is generally felt that SOVA decoders are simpler and faster. A particular limitation of the MAP approach is that it tends to be memory intensive. Hence, a need remains in the art for a soft output decision decoder which provides the superior performance of the MAP decoder while addressing the shortcomings and limitations of same.

SUMMARY OF THE INVENTION

The need in the art is addressed by the soft decision output decoder and decoding method of the present invention. The inventive decoder decodes a sequence of signals output by an encoder and transmitted over a channel. The inventive decoder includes two "generalized" Viterbi decoders (one for forward decoding and one for backward decoding) and a generalized dual maxima processor. The implementation of a dual maxima processor is described in detail in U.S. Pat. No. 5,442,627, entitled "NONCOHERENT RECEIVER EMPLOYING A DUAL-MAXIMA METRIC GENERATION PROCESS", assigned to the assignee of the present invention and incorporated by reference herein.

The first "generalized" Viterbi decoder decodes the sequence of signals received over the channel during a forward iteration through a trellis representing the encoder output having a block length T. The first "generalized" Viterbi decoder begins at an initial state to and provides a plurality of forward iteration state metrics $\alpha$ for each state at each time interval over a window of length L, where L is less than a block length T but otherwise independent of T. In the illustrative embodiment, the first decoder sums products of the forward state metrics $\alpha_t(s')$ for each previous state s' by a branch metric $\gamma_t(s',s)$ between each previous state s' and the selected state s to provide the forward state metric $\alpha_t(s)$ for the selected state s.

A second "generalized" Viterbi decoder decodes the sequence of signals received over the channel during a backward iteration through the trellis. The second decoder starts at a second time $t_{2L}$ and provides a plurality of backward iteration state metrics $\beta$ for each state at each time interval. In the illustrative embodiment, the second decoder sums products of the backward state metrics $\beta_{t+1}(s')$ for each subsequent state s' by a branch metric $\gamma_t(s,s')$ between each subsequent state s' and each selected state s to provide the branch metric $\beta_t(s)$ for the selected state s.

A processor then performs a generalized dual maxima computation at each time using the forward state metric of one state, the backward state metric of another state and the branch metric of the branch connecting the two state for same to provide a measure of the likelihood that a particular sequence of data was transmitted by the encoder. In the illustrative embodiment, the processor computes a log of the likelihood ratio using the forward and backward state metrics and the branch metrics for a selected state. This is achieved by first computing a max function as an approximation of the measure of the likelihood that a particular sequence of data was transmitted by the encoder. Then, a correction factor is computed for the approximation to provide a more exact measure of the likelihood that a particular sequence of data was transmitted by the encoder. In a specific embodiment, correction factor includes an exponential function of the forward state metric and the backward state metric and the branch metric for a selected state. A similar technique applies to the operation of the two generalized Viterbi decoders.

In an alternative embodiment, a third Viterbi decoder is provided for performing a second backward iteration through the trellis. The third decoder provides a second plurality of backward iteration state metrics β for each state at each time interval starting at a third time $t_{3L}$.

By performing forward and backward Viterbi decoding with dual maxima computations at each node within a window moved over the trellis, the invention provides the performance benefits associated with a LOG-MAP decoder while avoiding the excessive memory requirements of same.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
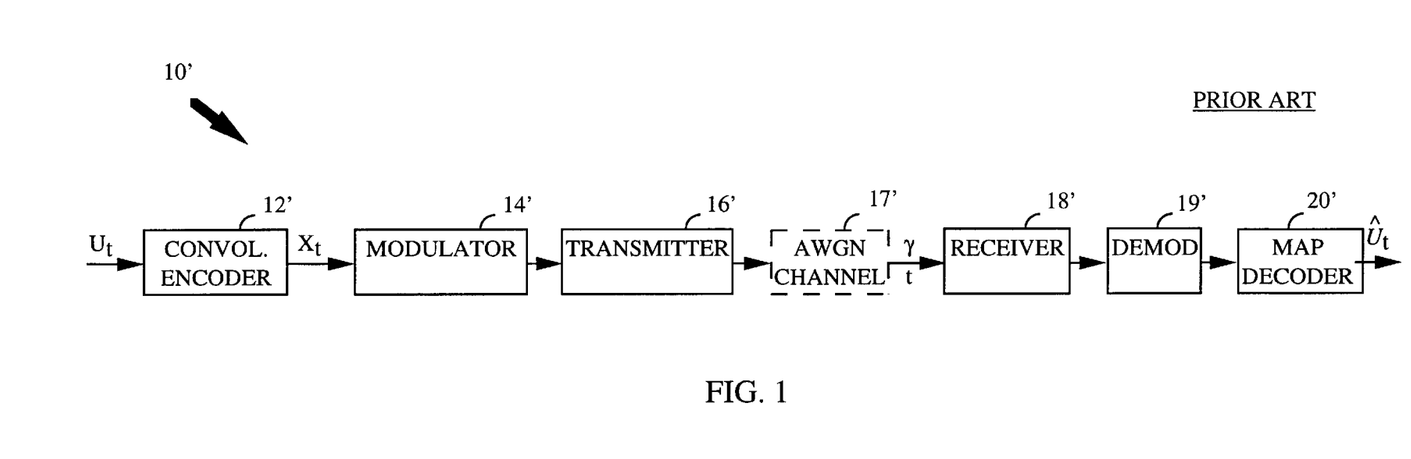
FIG. 1 is a block diagram of a transmitter and receiver operating over a channel using a conventional MAP decoder.

The present invention is best illustrated with a preliminary review of the MAP algorithm as is known in the art.
The MAP Approach:

FIG. 1 is a block diagram of a transmitter and receiver operating over a channel using a conventional MAP decoder. The system 10' includes a 1/N convolutional encoder 12' which receives an input sequence ut and outputs a signal stream $x_t$ to a modulator 14'. The modulator 14' modulates and spreads the signal in a conventional manner and provides it to the transmitter 16'. The transmitter 16' includes power amplifiers and antennas necessary to transmit the signal over an additive white Gaussian noise (AWGN) channel 17'. The signal received over the channel $y_t$ is despread and demodulated by a conventional demodulator 19' and forwarded to a MAP decoder 20'. The MAP decoder 20' outputs an estimate of the input sequence $u_t$.

The operation of the conventional MAP decoder 20' is described below with reference to FIG. 2.

Figure 2:
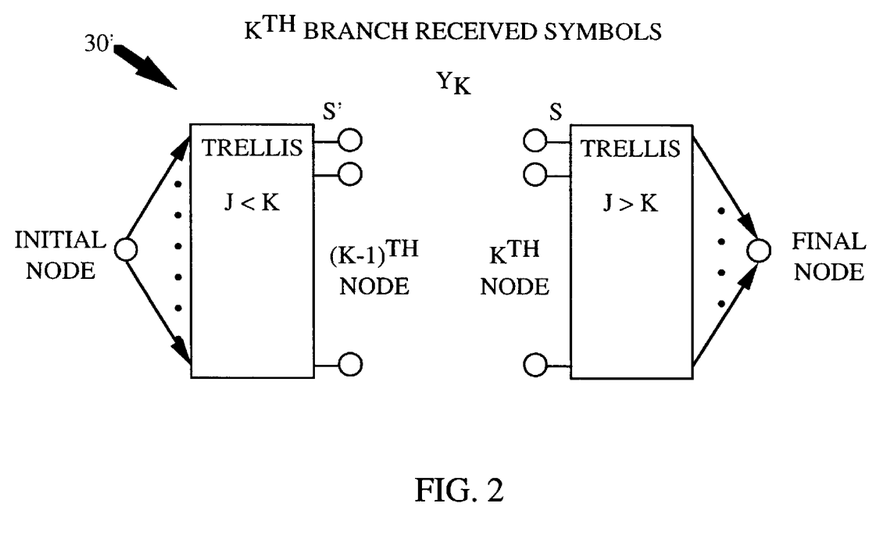
FIG. 2 is a trellis diagram of a blocked (or tailed off) convolutional code which starts and terminates in a zero state.

FIG. 2 is a trellis diagram of a blocked (or tailed off) convolutional code which starts and terminates in a zero state. Focusing on the kth branch of the trellis 30' the following definitions are useful:

$u_k$=bits associated with the kth branch;

s=generic state for the kth node (after kth branch);

s' =generic state for (k−1)th node (before kth branch);

$y_k$=vector or received symbols for kth branch;

$y_{k<k}$=vector of received symbols for all branches before kth branch;

$y_{j>k}$=vector of received symbols for all branches after kth branch; and $y = y_{j<k}, y_k, y_{j>k}$=vector of all received symbols over entire trellis.

Then using the independence of symbols y on successive received branches and the Markov property of the trellis, (state s and branch $y_k$ depend only on state s'), we have $$p(s', s, y) = p(s', s, y_{j<k}, y_k, y_{j>k}) \qquad (1)$$
$$= p(s', y_{j<k})p(y_k, s|s')p(y_{j>k}|s)$$
$$= \alpha_{k-1}(s')\gamma_k(s', s)\beta_k(s)$$

where $$\alpha_{k-1}(s') \stackrel{\Delta}{=} p(s', y_{j<k}); \alpha_k(s) = p(s, y_{j<k+1}) \qquad (2)$$

$$\beta_k(s) \stackrel{\Delta}{=} p(y_{j>k}|s); \beta_{k-1}(s') = p(y_{j>k-1}|s) \qquad (3)$$

$$\gamma_k(s', s) \stackrel{\Delta}{=} p(y_k, s|s') = p(y_k|s, s')p(s|s'). \qquad (4)$$

Note from these expressions the recursions $$\alpha_k(s) = \sum_{s'} \alpha_{k-1}(s')\gamma_k(s', s) \quad \text{(forward)} \qquad (5)$$

$$\beta_{k-1}(s') = \sum y_k(s', s)\beta_k(s) \quad \text{(backward)} \qquad (6)$$

with initial and final conditions $\alpha_0(s)=1=\beta_N$.

With these preliminaries, we can establish the measure of interest, the soft output for the kth branch. For the sake of simplicity, we consider a binary trellis which pertains to a single bit for each branch, which we denote u (the generation to a several bit branch—as for trellis coded modulation—will be straightforward). The likelihood ratio of $u_k$ given y is:

$$\Lambda_K = \frac{p(u_k = +1|y)}{p(u_k = -1|y)} = \qquad (7)$$

-continued $$\frac{\sum_{s',s:u_k=+1} p(s',s,y)}{\sum_{s',s:u_k=-1} p(s',s,y)} = \frac{\sum_{s',s:u_k=+1} \alpha_{k-1}(s')\gamma_k(s',s)\beta_k(s)}{\sum_{s',s:u_k=-1} \alpha_{k-1}(s')\gamma_k(s',s)\beta_k(s)}$$

where the summations of numerator and denominator are over those pairs of states for which $u_k=+1$ and $u_k=-1$, respectively and the conditional probabilities of the first ratio are replaced by joint probabilities according to Bayes rule and cancellation of the common term p(y) in numerator and denominator. The likelihood ratio of eq. (7) provides a measure of the probability that a +1 was transmitted versus a −1 at time t. When the likelihood ratio is computed for each time period, the code has been decoded. With hard decision output decoders, if a '1' is more likely than a '0', it is decoded as '1', otherwise, it is decoded as a '0'. But with turbo codes, a hard decision is not actually made. Instead, the likelihood ratios are retained as a level of confidence. Accordingly, the function of the decoder is to provide an indication of what has been transmitted and the level of confidence for same as determined by the likelihood ratio (i.e., eq. (7)).

The MAP algorithm, then, consists of the operation eq. (7) coupled with the recursions of eqs. (5) and (6) which employ the branch likelihood eq. (4). Note that because equation (7) is a ratio, the $\alpha$ and $\beta$ state metrics can be normalized at any node, which keeps all of them from overflowing.

The conventional MAP approach as described above has been known in the art for over twenty years and generally ignored because:

a) with hard decision outputs, performance is almost the same as for the Viterbi algorithm and b) complexity is much greater because of the multiplication operation required and the additional backward recursion. That is, the entire trellis 30' must be stored. The memory required is on the order of the length of the trellis times the number of states times the storage required for each state.

With the incentive provided by turbo codes and SCIC and their improved performance employing MAP, interest was rekindled and it was recognized that simplification can be effected without compromising performance, as described below.

LOG-MAP, A DUAL GENERALIZED VITERBI APPROACH

Taking the logarithms of all parameters in equations (4–7), we define each as the Latin symbol equivalent of the Greek symbol, $a=\ln\alpha$, $b=\ln\beta$, $c=\ln\gamma$ and $L=\ln\Lambda$.

Thus, equations (4–7) become $$c_k(s',s) = \ln p(y_k | s, s') + \ln P(s | s') \text{ the branch metric} \quad (4')$$

$$a_k(s) = \ln \sum_{s'} \exp[a_{k-1}(s') + c_k(s',s)]; a_0(s) = 0 \quad (5')$$

$$b_{k-1}(s') = \ln \sum_{s} \exp[c_k(s',s) + b_k(s)]; b_N(s) = 0 \quad (6')$$

$$L_k = \ln \sum_{s'=s:u_k=+1} \exp(a_{k-1} + c_k + b_k) - \ln \sum_{s'=s:u_k=-1} \exp(a_{k-1} + c_k + b_k) \quad (7')$$

Note that for a binary tree, the summations in equations (5') and (6') are over just two terms, while in equation (7'), each is over half the connected state-pairs of which there are in all $2^m$ in each subset where m is the number of memory elements of the convolutional encoder 12'. Note also that since the $\alpha$ and $\beta$ metrics could be normalized by a common factor at each node, the a and b metrics can be reduced by a common amount at each node.

The first revelation comes about as a result of the approximation $$\ln\left(\sum_i e^{x_i}\right) \approx \text{Max}(x_i) \quad (8)$$

with the approximation improving as the values $x_i$ diverge. Then equations (5') and (6') become the Viterbi algorithm recursions forward and backward, respectively, where the latter begins with the final node. Similarly, equation (7') becomes the dual-maxima procedure. Hence, we arrive at a forward and backward Viterbi algorithm, coupled together at each node by a dual-maxima computation. Accordingly, the soft output decision decoder of the present invention includes a forward Viterbi decoder, a backward Viterbi decoder and a dual maxima processor.

Figure 3:
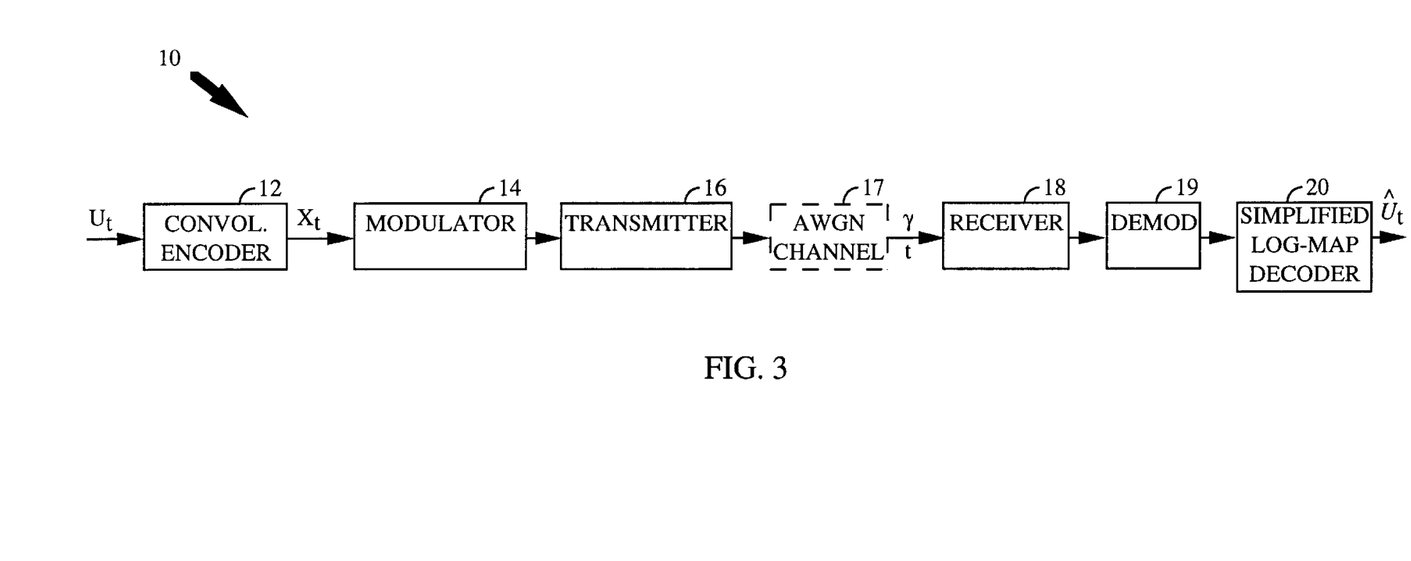
FIG. 3 is a block diagram of a transmitter and receiver operating over a channel and using a simplified LOG-MAP decoder in accordance with the teachings of the present invention.

FIG. 3 is a block diagram of a transmitter and receiver operating over a channel and using a simplified LOG-MAP decoder in accordance with the teachings of the present invention. The system 10 includes a convolutional encoder 12 which receives an input sequence $u_t$ and outputs a signal stream $x_t$ to a modulator 14. The modulator 14 modulates the signal in a conventional manner and provides it to the transmitter 16. The transmitter 16 includes power amplifiers and antennas necessary to transmit the signal over the channel 17. The signal received over the channel $y_t$ is demodulated by a conventional demodulator 19 and forwarded to the simplified LOG-MAP decoder 20 designed in accordance with the present teachings. The decoder 20 is a soft decision output decoder which outputs an estimate of the input sequence $u_t$.

Figure 4:
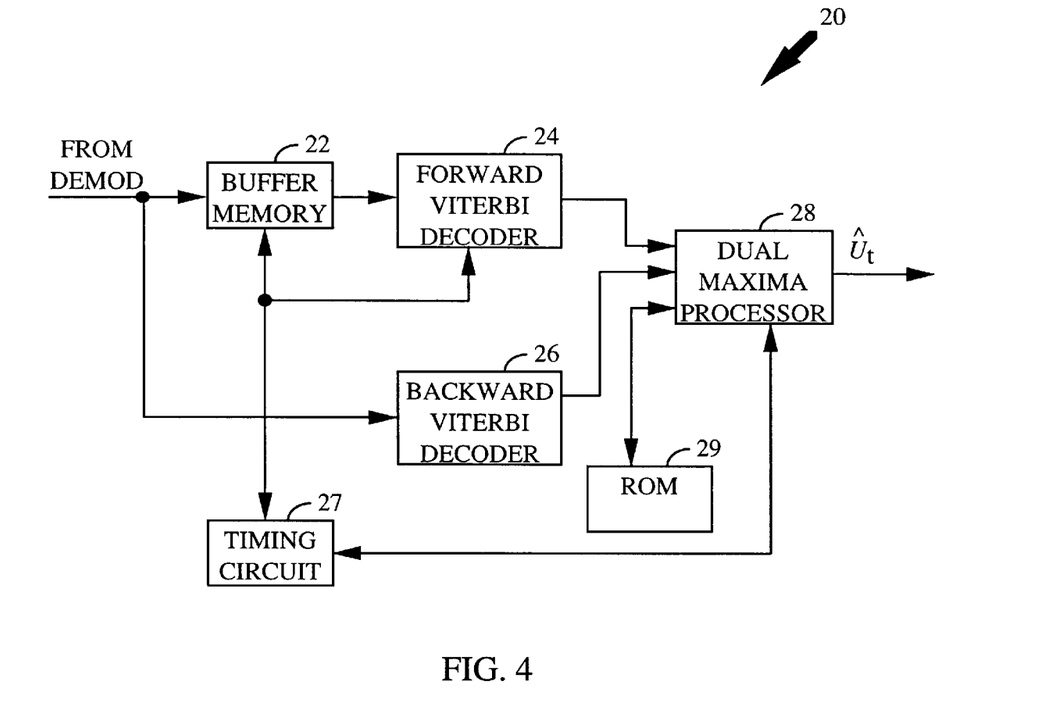
FIG. 4 is a block diagram of an illustrative implementation of the soft output decision decoder of the present invention.

FIG. 4 is a block diagram of an illustrative implementation of the soft output decision decoder 20 of the present invention. In the illustrative implementation, the decoder 20 includes a buffer memory 22 which receives the demodulated received signal from the demodulator 19. The buffer memory delays the inputs to a forward Viterbi decoder 24 until enough signal samples are received for a backward Viterbi decoder 26 to initiate a backward recursion through the trellis. The outputs of the forward Viterbi decoder 24 and the backward Viterbi decoder 26 are input to a dual maxima processor 28. The dual maxima processor provides an estimate of the sequence $u_t$ under control of a timing circuit 27 and using a correction factor supplied by a read-only memory (ROM) 29 as described more fully below. The dual maxima processor 28 may be implemented with an application specific integrated circuit (ASIC), a digital signal processor (DSP) or a microprocessor by one of ordinary skill in the art.

The operation of the decoder 20 is described below with reference to FIG. 5.

Figure 5:
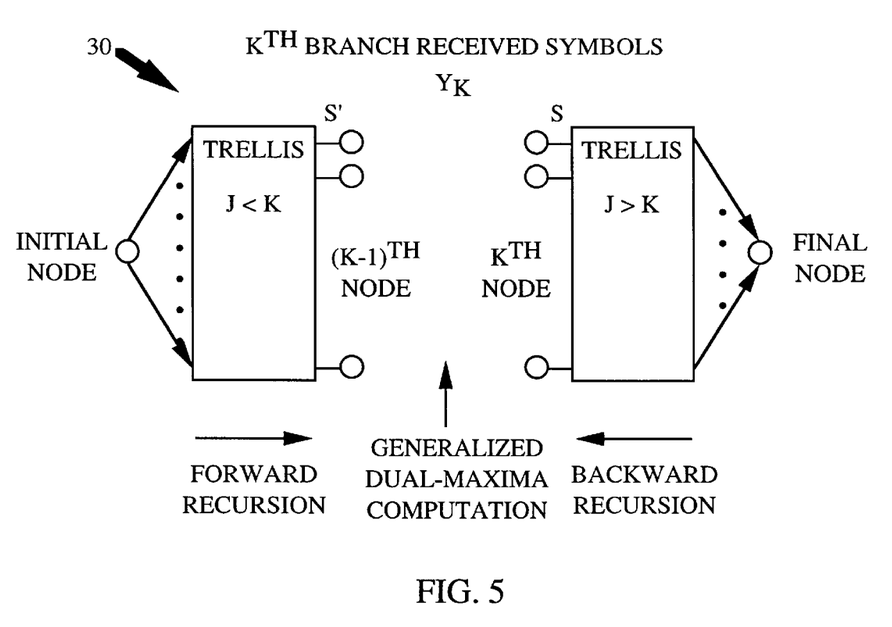
FIG. 5 is a trellis diagram of a blocked (or tailed off) convolutional code which starts and terminates in a zero state.

FIG. 5 is a trellis diagram of a blocked (or tailed off) convolutional code which starts and terminates in a zero state. The trellis 30 is the same as that 30' of FIG. 2 with the exception that the forward and backward recursions are joined together at each node by the dual maxima computation of eq. (7').

Unfortunately, the approximation of equation (8) necessarily produces some degradation. This can be avoided by using the second revelation, the identity $$\ln(e^x + e^y) = \text{Max}(x, y) + \ln(1 + e^{-|x-y|}) \quad (9)$$

$$\stackrel{\Delta}{=} g(x, y)$$

The second term is a correction factor which is implemented using a look-up table stored in ROM 29. The ROM 29 is driven by $|x-y|$ while sign $(x-y)$ is required to determine $\text{Max}(x,y)$.

To obtain a precise form of equation (8) when there are more than two terms in the sum, we nest the operations $g()$ to obtain $$\ln \sum_{i=1}^{l} e^{x_i} g(x_i, g(x_{l-1}, \ldots g(x_3, g(x_2, x_1)) \ldots ) \quad (10)$$

which is required for eq. (7'), as well as for eqs. (5') and (6') when the trellis structure is nonbinary.

But the conclusion is the same with the correction (second term of eq. (9)) providing for the exact form. Hence, in accordance with one aspect of the present teachings, the LOG-MAP approach is implemented as two generalized Viterbi decoders coupled by a generalized dual-maxima procedure where the generalization involves adding the correction term to the max (x,y) function of eq. (8) to obtain the function g(s,y) of eq. (9).

Implementation for Memory Reduction

The remaining drawback of the LOG-MAP approach set forth above is that it is memory intensive. The entire state metric history must be stored, out to the end of the trellis, at which point the backward algorithm begins and decisions can be output starting with the last branch, without need to store any but the last set of state metrics computed backward. This storage requirement is obviously excessive. For a 16-state code, assuming 6-bit state metrics, it would require 96 bits of storage per branch, for a total of 96,000 bits for a 1,000 bit block, judged to be minimal for turbo code performance by those skilled in the art.

This problem is addressed by the present invention. Although the teachings of the invention may be implemented in a number of embodiments, two illustrative embodiments are described herein: one involving a single backward iteration and one involving two backward iterations. The basis for both approaches is the fact that the Viterbi decoder can start cold in any state at any time. Initially the state metrics are of little value, but after a few constraint lengths, the set of state metrics are as reliable as if the process had been started at the initial (or final) node. Let this "learning" period consist of L branches. (For a 16 state code, L=32 should be more than sufficient, amounting to over 6 constraint lengths of the convolutional code.) This applies equally to the backward as well as the forward algorithm and assumes that all state metrics are normalized by subtracting at every node an equal amount from each. Both methods reduce the memory requirement for a 16-state code to just a few thousand bits, independent of the block length T.

MEMORY REDUCTION USING A SINGLE BACKWARD ITERATION

In this implementation, we let the received branch symbols be delayed by 2L branch times where L is the length of a window on the trellis 30. Then we set an initial condition of '1' in a linear implementation (or '0' in a log implementation) for the initial node and zero for all other nodes at the initial time $t_0$. Next, the forward Viterbi decoder 24 of FIG. 4 starts computing forward state metrics at the initial node at time to for each node every branch time in accordance with equation (5 or 5'). These state metrics are stored in a memory in the processor 28. This process is depicted in the diagram of FIG. 6.

Figure 6:
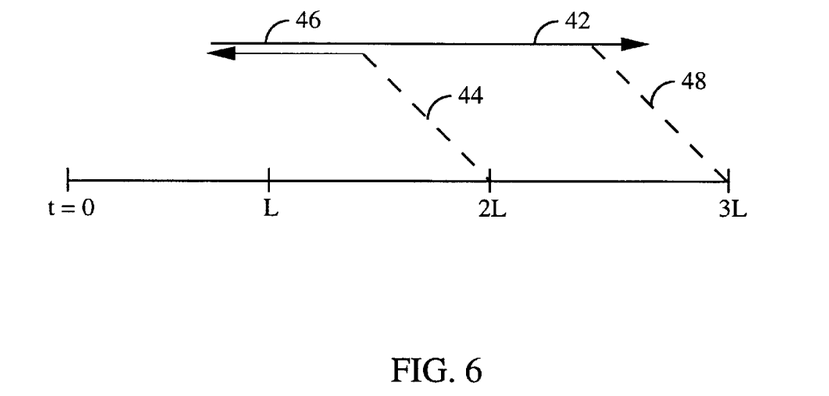
FIG. 6 shows the timing for the forward and backward Viterbi decoders in accordance with a first illustrative implementation of the reduced memory simplified LOG-MAP method of the present invention.

FIG. 6 shows the timing for the forward and backward Viterbi decoders in accordance with the first illustrative embodiment of the present invention. From time t=0 to time t=L, the generalized forward Viterbi algorithm computes the forward state metric is shown by segment 42. At time t=L, the forward iteration is suspended and a backward iteration is initiated by the backward Viterbi decoder 26 of FIG. 4. The backward iteration is initiated not from the end of the trellis as with the conventional approach, but from time 2L as though it were the end of a frame of length 2L. The nodes or states of the trellis 30 are all set at the initial value of '1' in a linear implementation or '0' in a log implementation. At first, the metrics are again unreliable as shown by the dashed line 44 in FIG. 6. These metrics become reliable after L as shown by 46. Hence, at time L, we have reliable forward and backward metrics. At this point, the generalized dual-maxima process may be performed according to equation (7') and soft decisions corresponding to the first L branches are output. We can now discard the forward metrics from time t=0 to time t=L. Backward metrics are discarded upon computation of the next set of backward metrics.

Next, the forward Viterbi decoder 24 moves forward from time t=L and forward metrics for each node are computed as above until time 2L. This is shown again by the line segment 42 in FIG. 6. At 2L the forward decoding is suspended and the backward Viterbi decoder 26 begins to generate metrics from time 3L. Again, these metrics are unreliable until time 2L as shown by the dashed line 48. However, from L to 2L, we now have reliable forward and backward metrics. Hence, we may compute the likelihood ratio during this time interval, using the generalized dual maxima computations.

Figure 7:
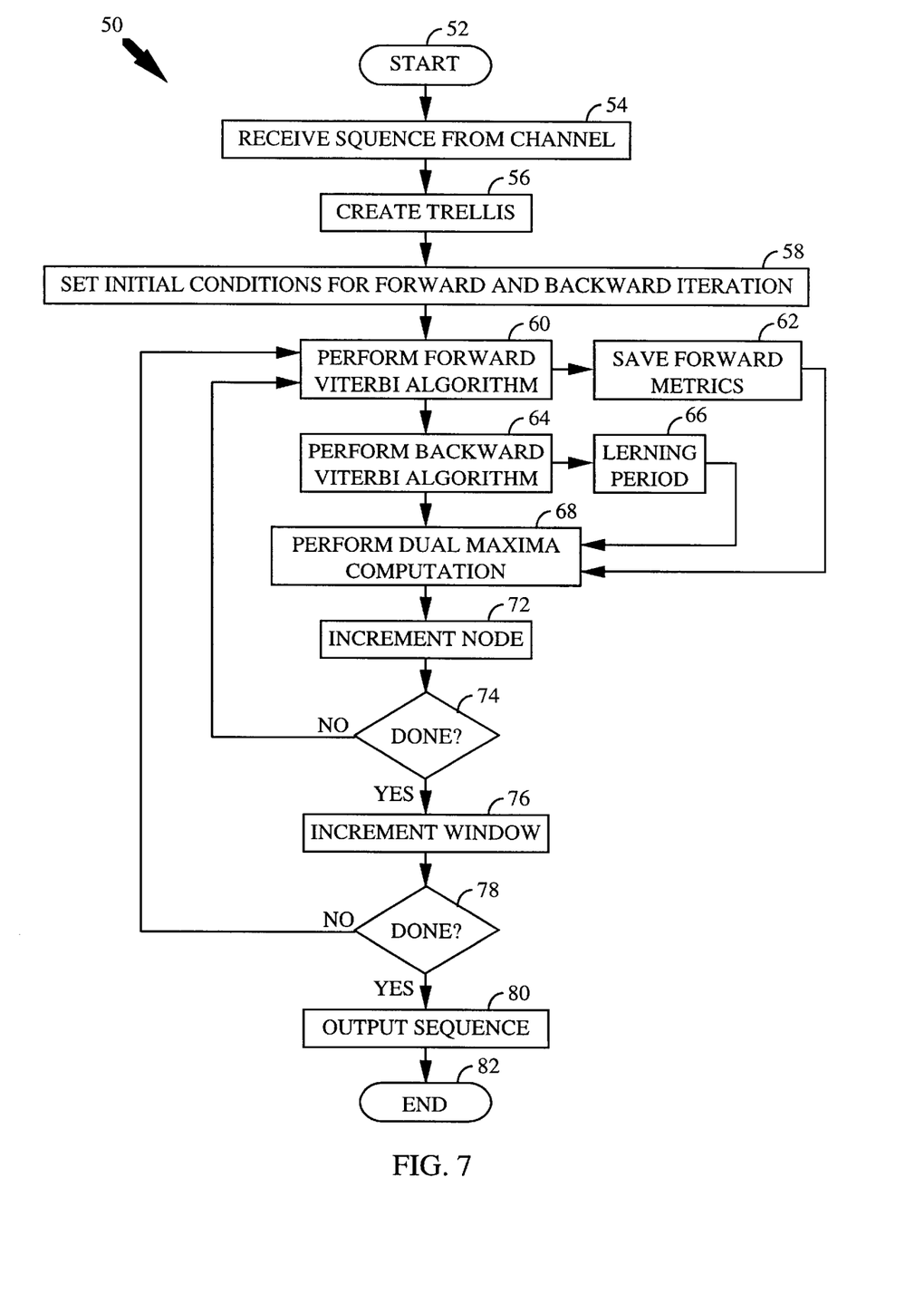
FIG. 7 is a flow diagram of the first illustrative implementation of the reduced memory simplified LOG-MAP method of the present invention.
Figure 8A:
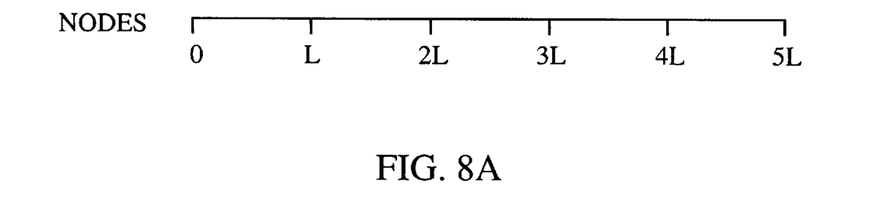
FIG. 8 shows the timing for the forward and backward Viterbi decoders in accordance with a second illustrative implementation of the reduced memory simplified LOG-MAP method of the present invention.
Figure 8B:
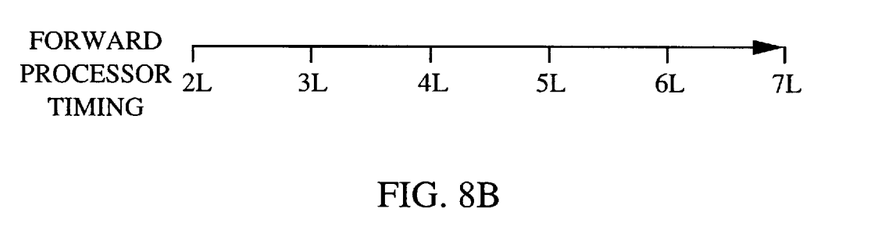
Figure 8C:
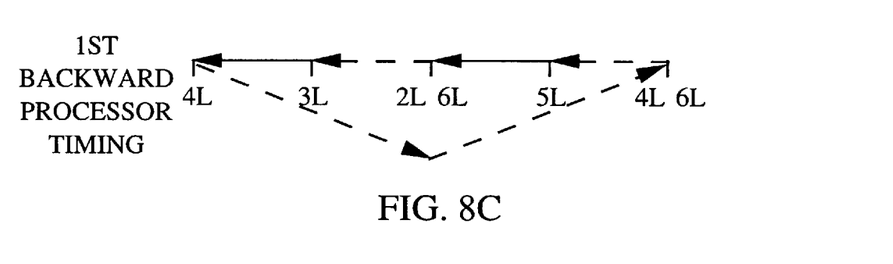
Figure 8D:
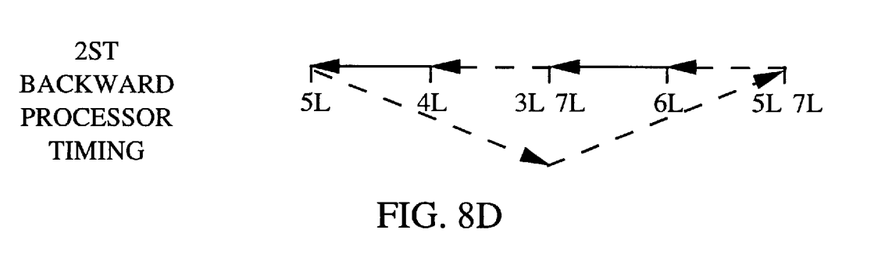
Figure 8E:
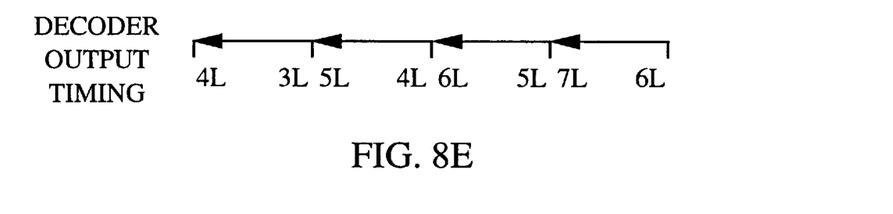

The method of this first illustrative implementation is depicted in the flow diagram of FIG. 7. As depicted in FIG. 7, the above described process is repeated over the entire trellis 30.

Those skilled in the art will appreciate that the memory required is on the order of L times the number of states instead of T times the number of states where T is the trellis frame length and L<<T. Those skilled in the art will also be able to choose an optimal frame length. In the illustrative embodiment, a frame length of L in the range of 5 to 7 constraint lengths was found to be sufficient.

Alternative Implementation

For the alternative illustrative implementation, reference is made to FIG. 8 which shows the bit processing times for one forward processor and two backward processors operating in synchronism with the received branch symbols, i.e., computing one set of state metrics during each received branch time (bit time for a binary trellis). Once again we let the received branch symbols be delayed by 2L branch times. The forward decoder 24 of FIG. 4 starts again at the initial node at branch time 2L, computing all state metrics for each node every branch time and storing these in memory. For this implementation, the first and second backward Viterbi decoders are shown generally as '26' in FIG. 4. The first backward decoder starts at the same time as the forward decoder 24 but processes backward from the 2Lth node, setting every initial state metric to the same value, not storing anything until branch time 3L, at which point it has built up reliable state metrics and it encounters the last of the first set of L forward computed metrics. At this point, the generalized dual-maxima process is performed according to equation (7'), the Lth branch soft decisions are output, and the backward processor proceeds until it reaches the initial node at time 4L. Meanwhile, starting at time 3L, the second backward decoder begins processing with equal metrics at node 3L, discarding all metrics until time 4L, when it encounters the forward algorithm having computed the state metrics for the 2Lth node. The generalized dual-maxima process is then turned on until time 5L, at which point all soft decision outputs from the 2Lth to the Lth node will have been output. The two backward processors hop forward 4L branches every time they have generated backward 2L sets of state metrics and they time-share the output processor, since one generates useless metrics while the other generates the useful metrics which are combined with those of the forward algorithm.

Figure 9:
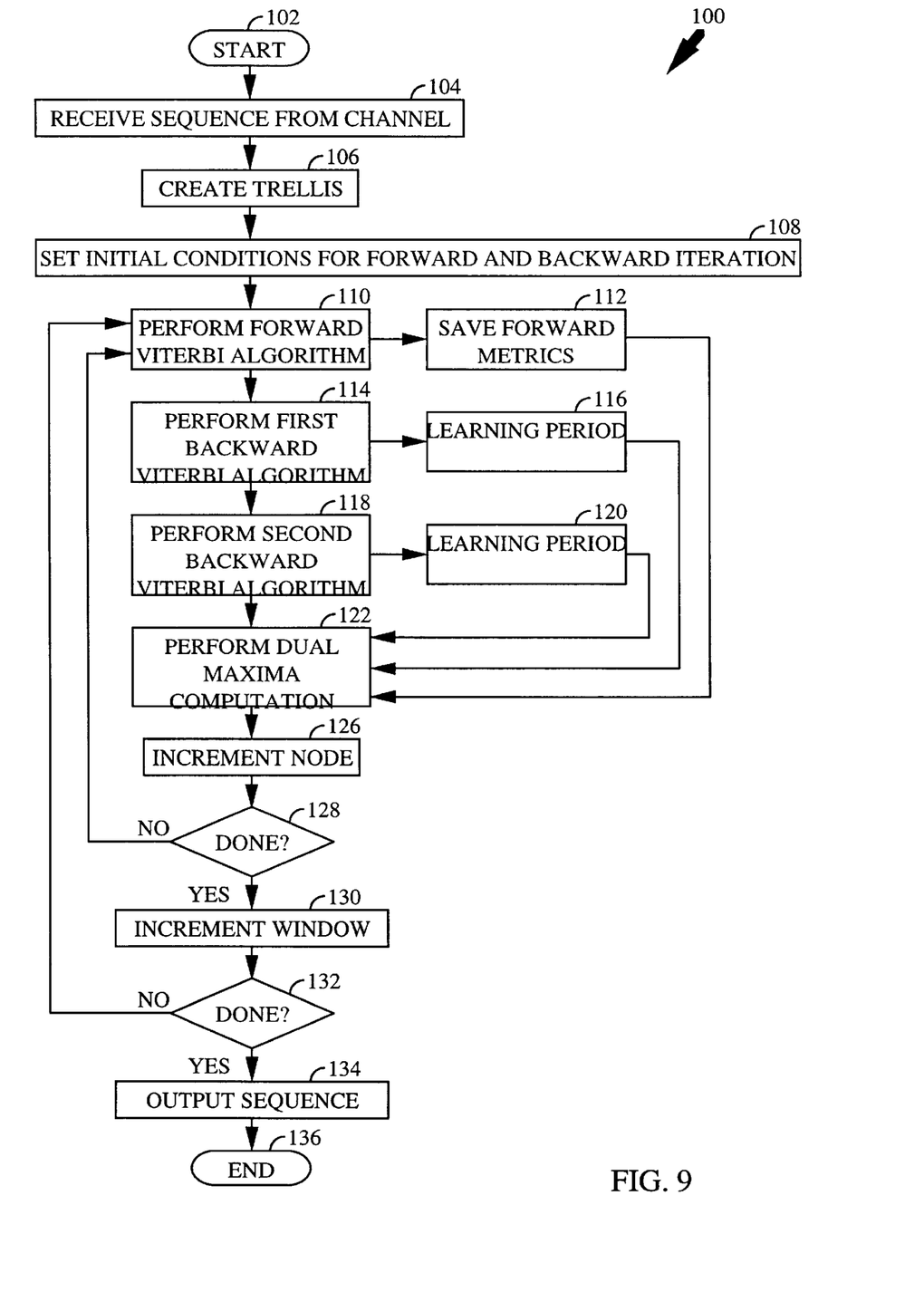
FIG. 9 is a flow diagram of the second illustrative implementation of the reduced memory simplified LOG-MAP method of the present invention.

The method of this alternative implementation is illustrated in the flow diagram of FIG. 9. Note that nothing needs to be stored for the backward algorithms except for the metric set of the last node and these only when reliable metrics are being generated. The forward algorithm only needs to store 2L sets of state metrics since after its first 2L computations (performed by time 4L), its first set of metrics will be discarded and the emptied storage can then be filled starting with the forward-computed metrics for the (2L+1)th node (at branch time 4L+1). Thus the storage requirements for a 16-state code using 6-bit state metrics is just 192L bits in all, which for L=32 amounts to approximately 6,000 bits. (Note further that a conventional K=7 Viterbi decoder with 64 states and a 32-bit path memory requires about 2,000 bits of memory, while a K=9 decoder requires at least a 40-bit path memory resulting in over 10,000 bits of storage). Hence, the LOG-MAP storage requirements are no greater than those of a conventional Viterbi algorithm.

As for processing requirements, it would appear that the Viterbi algorithm load is thus tripled; furthermore, the complexity of the generalized dual-maxima process is no greater than that of the forward or backward Viterbi algorithm processor, so that overall the complexity is not more than quadrupled. Also, the chain-back procedure is avoided. Further, since the code is shorter, the number of states is reduced by a factor of 4 or 16 for the K=7 and 9 examples given. Since the MAP decoder (with short constraint length) is only justified for turbo codes, we must also account for the required number of iterations, which are of the order of 4 to 8. thus a 16-state serial turbo decoder performing 8 iterations imposes double the processing load of a K=9 Viterbi decoder and 8 times that of a K=7 decoder.

Minimum decoding delay is set by the length of the block or its corresponding interleaver. If the processors described above operate at just the speed of the received branches, it may be necessary to pipeline the successive iterations and hence multiply the minimum delay by the number of iterations. If, on the other hand, the processors can operate at a much higher speed, then additional delay can be much reduced.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A system for decoding a sequence of signals output by an encoder and transmitted over a channel, said encoder output represented by a trellis having a block length T, said system comprising:

first means for Viterbi decoding said sequence of signals received over said channel during a forward iteration through said trellis, said first means providing a plurality of forward iteration state metrics (x for each state at each time interval over a window of length 2L, where L is a number of constraint lengths and 2L is less than block length T, wherein said forward iteration begins at an initial state $t_0$;

second means for Viterbi decoding said sequence of signals received over said channel during a backward iteration through said trellis, said second means providing a plurality of backward iteration state metrics β for each state at each time interval starting at a second time; and third means for performing a dual maxima computation at each state using the forward state metrics, the backward state metrics and the branch metrics for same to provide a measure of the likelihood that a particular sequence of data was transmitted by said encoder.

2. The invention of claim 1 wherein said first means includes means for multiplying a forward state metric $\alpha_{t-1}$(s') for a previous state s' by a branch metric $\gamma_t$(s',s) to provide said forward state metric $\alpha_t$(s) for a selected state s.

3. The invention of claim 2 wherein said first means includes means for summing products of the forward state metrics $\alpha_{t-1}$(s') for each previous state s' by a branch metric $\gamma_t$(s',s) between each previous state s' and the selected state s to provide said forward state metric $\alpha_t$(s) for the selected state s.

4. The invention of claim 1 wherein said second means includes means for multiplying a backward state metric $\beta_{t+1}$(s') for a subsequent state s' by a branch metric $\gamma_t$(s,s') to provide said branch metric $\beta_t$(s) for a selected state s.

5. The invention of claim 4 wherein said second means includes means for summing products of the backward state metrics $\beta_{t+1}$(s') for each subsequent state s' by a branch metric $\gamma_t$(s,s') between each subsequent state s' and each selected state s to provide said branch metric $\beta_t$(s) for the selected state s.

6. The invention of claim 1 wherein said means for performing a dual maxima computation includes means for computing a likelihood ratio.

7. The invention of claim 6 wherein said means for computing a likelihood ratio includes means for computing the log of the likelihood ratio.

8. The invention of claim 1 wherein said third means includes means for computing a max function as an approximation of the measure of the likelihood that a particular sequence of data was transmitted by said encoder.

9. The invention of claim 8 wherein said third means includes means for providing a correction factor for said approximation to provide a more exact measure of the likelihood that a particular sequence of data was transmitted by said encoder.

10. The invention of claim 9 wherein said correction factor includes an exponential function of the forward state metric and the backward state metric and the branch metric for a selected state.

11. The invention of claim 1 wherein said second means includes means for providing a second backward iteration through said trellis, said second means providing a second plurality of backward iteration state metrics β for each state at each time interval starting at a third time $t_{3L}$.

12. A soft decision output decoder comprising:

means for receiving a sequence of transmitted codewords;

means for providing a trellis for decoding of said sequence of codewords, said trellis having a block length T;

first means for decoding said sequence of signals received over said channel during a forward iteration through said trellis, said first means providing a plurality of forward iteration state metrics α for each state at each time interval over a window of length 2L, where L is a number of constraint lengths and 2L is less than a block length T, wherein said forward iteration begins at an initial state $t_0$, said first means including means for summing products of forward state metrics $\alpha_{t-1}(s')$ for each previous state s' by a branch metric $\gamma_t(s',s)$ between each previous state s' and the selected state s to provide a forward state metric $\alpha_t(s)$ for the selected state s;

second means for decoding said sequence of signals received over said channel during a backward iteration through said trellis, said second means including:

means for summing products of the backward state metrics $\beta_{t+1}(s')$ for each subsequent state s' by a branch metric $\gamma_t(s,s')$ between each subsequent state s' and each selected state s to provide a first plurality of backward iteration state metrics $\beta_t(s)$ for each selected state s at each time interval starting at a second time $t_{2L}$ and means for summing products of the backward state metrics $\beta_{t+1}(s')$ for each subsequent state s' by a branch metric $\gamma_t(s,s')$ between each subsequent state s' and each selected state s to provide a second plurality of backward iteration state metrics $\beta_t(s)$ for each selected state s at each time interval starting at a third time $t_{3L}$; and third means for performing a dual maxima computation at each state using the forward state metrics, the backward state metrics and the branch metrics for same to provide a measure of the likelihood that a particular sequence of data was transmitted by said encoder.

13. The invention of claim 12 wherein said means for performing a dual maxima computation includes means for computing a likelihood ratio.

14. The invention of claim 13 wherein said means for computing a likelihood ratio includes means for computing the log of the likelihood ratio.

15. The invention of claim 12 wherein said third means includes means for computing a max function as an approximation of the measure of the likelihood that a particular sequence of data was transmitted by said encoder.

16. The invention of claim 15 wherein said third means includes means for providing a correction factor for said approximation to provide a more exact measure of the likelihood that a particular sequence of data was transmitted by said encoder.

17. The invention of claim 16 wherein said correction factor includes an exponential function of the forward state metric and the backward state metrics and the branch metric for a selected state.

18. A method for decoding a convolutionally encoded codeword including the steps of:

a) providing a trellis representative of an output of an encoder used to encode said codeword, said trellis having a block length T;

b) assigning an initial condition to each starting node of the trellis for a forward iteration through the trellis;

c) assigning an initial condition to each starting node for a backward iteration through the trellis;

d) computing a forward metric for each node in a window of length L on the trellis during a forward iteration, where the window length L is less than the block length T;

e) computing, during a backward iteration, a backward metric for each node in a window of length L on the trellis starting at a time 2L from a point at which the forward iteration is initiated;

f) computing a dual maxima for each node using the forward metric and the backward metric to decode said codeword; and g) repeat steps d)–f) over entire block.

19. The invention of claim 18 wherein the step f) includes the step of log mapping.

20. The invention of claim 18 wherein the step e) includes a step of initiating a second backward iteration starting at time 3L from a point at which the forward iteration is initiated.

21. A method for decoding a convolutionally encoded codeword including the steps of:

a) providing a trellis representative of an output of an encoder used to encode said codeword, said trellis having a block length T;

b) assigning an initial condition to each starting node of the trellis for a forward iteration through the trellis;

c) assigning an initial condition to each starting node for a backward iteration through the trellis;

d) using a Viterbi algorithm to compute a forward metric for each node in a window of length L on the trellis during a forward iteration, where the window length L is less than the block length T;

e) using a Viterbi algorithm to compute, during a backward iteration, a backward metric for each node in a window of length L on the trellis starting at a time 2L from a point at which the forward iteration is initiated;

f) computing a dual maxima for each node using the forward metric and the backward metric to decode said codeword; and g) repeat steps d)–f) over entire block.

22. The invention of claim 21 wherein the step f) includes the step of log mapping.

23. The invention of claim 21 wherein the step e) includes a step of initiating a second backward iteration starting at time 3L from a point at which the forward iteration is initiated.

* * * * *